United States Patent [19]

Kennedy

[11] 4,414,504
[45] Nov. 8, 1983

[54] FRACTIONAL DOPPLER COUNTING

[75] Inventor: Howard L. Kennedy, Phoenix, Ariz.

[73] Assignee: Motorola Inc., Schaumburg, Ill.

[21] Appl. No.: 204,097

[22] Filed: Nov. 5, 1980

[51] Int. Cl.³ .......................................... G01R 23/02
[52] U.S. Cl. ............................. 324/78 R; 324/79 R; 324/83 R; 324/83 D
[58] Field of Search .................. 324/78 R, 79 R, 83 R, 324/83 D; 331/25; 328/155; 343/106 D

[56] References Cited

U.S. PATENT DOCUMENTS

| | | | |
|---|---|---|---|
| 3,764,903 | 10/1973 | Griswold | 324/83 D |
| 3,916,307 | 10/1975 | Hekimian | 324/83 R |
| 3,977,002 | 8/1976 | Barton | 324/79 R |
| 3,978,403 | 8/1976 | Mansfield | 324/79 R |
| 3,982,190 | 9/1976 | Schaefer | 324/83 D |
| 3,984,770 | 10/1976 | Chu | 324/83 D |

Primary Examiner—Michael J. Tokar
Attorney, Agent, or Firm—Eugene A. Parsons

[57] ABSTRACT

A system for measuring Doppler frequency cycle count over a predetermined time period wherein a phase locked VCO is operated at N times the Doppler to allow measurement of both integral and fractional cycles. The resolution of the measurement is a function of the factor N.

6 Claims, 2 Drawing Figures

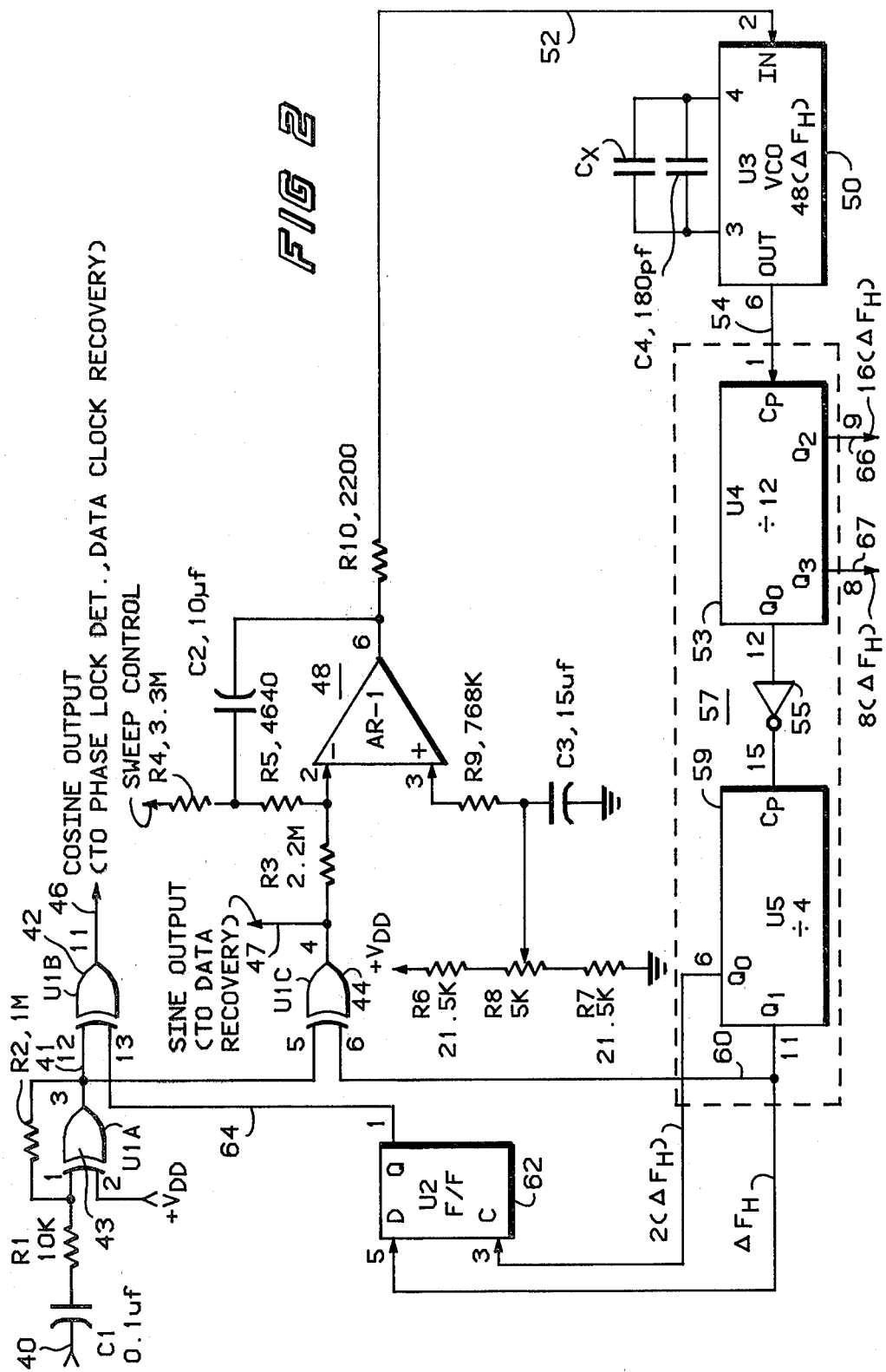

FRACTIONAL DOPPLER COUNTING

BACKGROUND OF THE INVENTION

In Doppler frequency measurement equipment used in navigational systems, it is essential to obtain accurate measurements including an exact indication of any partial Doppler cycles present in the measurement. Some prior art devices use analog multiplying techniques on the input signal or a combination of several input signals to increase the resolution of the Doppler measurement prior to digitizing the measurement. Another technique for making accurate measurements of partial Doppler cycles is embodied in copending patent application Ser. No. 025,260 by Stulting et al. and assigned to the common assignee, entitled, "Method and Apparatus For Measuring Received Doppler Cycles For a Specified Period of Time". The technique used there counts both full and partial cycles of Doppler input signal utilizing a counter having clock pulses many times the expected Doppler frequency. The partial cycle count is compared to the full cycle count for the same period and a calculation made to determine the fractional count.

The prior art systems introduce a high degree of complexity in their circuits and/or require counters capable of responding to very high frequency clock pulses.

SUMMARY OF THE INVENTION

The instant invention does not require use of a time interval counter and subsequently computations for determining the fractional count in the Doppler cycles are much simpler. Rather, a voltage controlled oscillator (VCO) operates at a multiple of the Doppler frequency and a Doppler counter is utilized which has additional capacity for the higher frequency. Counting fractional Doppler cycles with adequate resolution is accomplished without adding significantly to the complexity of the system using only a few low cost parts. Where such a Doppler counting system is employed in a position location system such as the Navy Navigational Satellite System (TRANSIT) the precision of the position locating system is much improved.

It is, therefore, an object of the invention to employ a VCO in a phase locked loop which operates at a multiple of the Doppler frequency, thereby improving the accuracy of the count without the utilization of a high frequency time interval counter for counting fractional cycles.

It is another object of the invention to lock a VCO at a multiple of the Doppler frequency through use of a phase locked loop. The higher frequency is then counted by a Doppler counter which has additional high frequency capacity in order to accommodate the higher input frequency.

These and other objects and advantages of the instant invention will be more readily understood upon study of the Detailed Description of the Invention, below, together with the drawings in which:

FIG. 1 is an overall block diagram of a system utilizing a VCO locked to a frequency which is a multiple of a Doppler frequency; and FIG. 2 is a more detailed logic diagram of the phase locked loop including the VCO of the block diagram of FIG. 1.

DETAILED DESCRIPTION OF THE INVENTION

Figure 1:
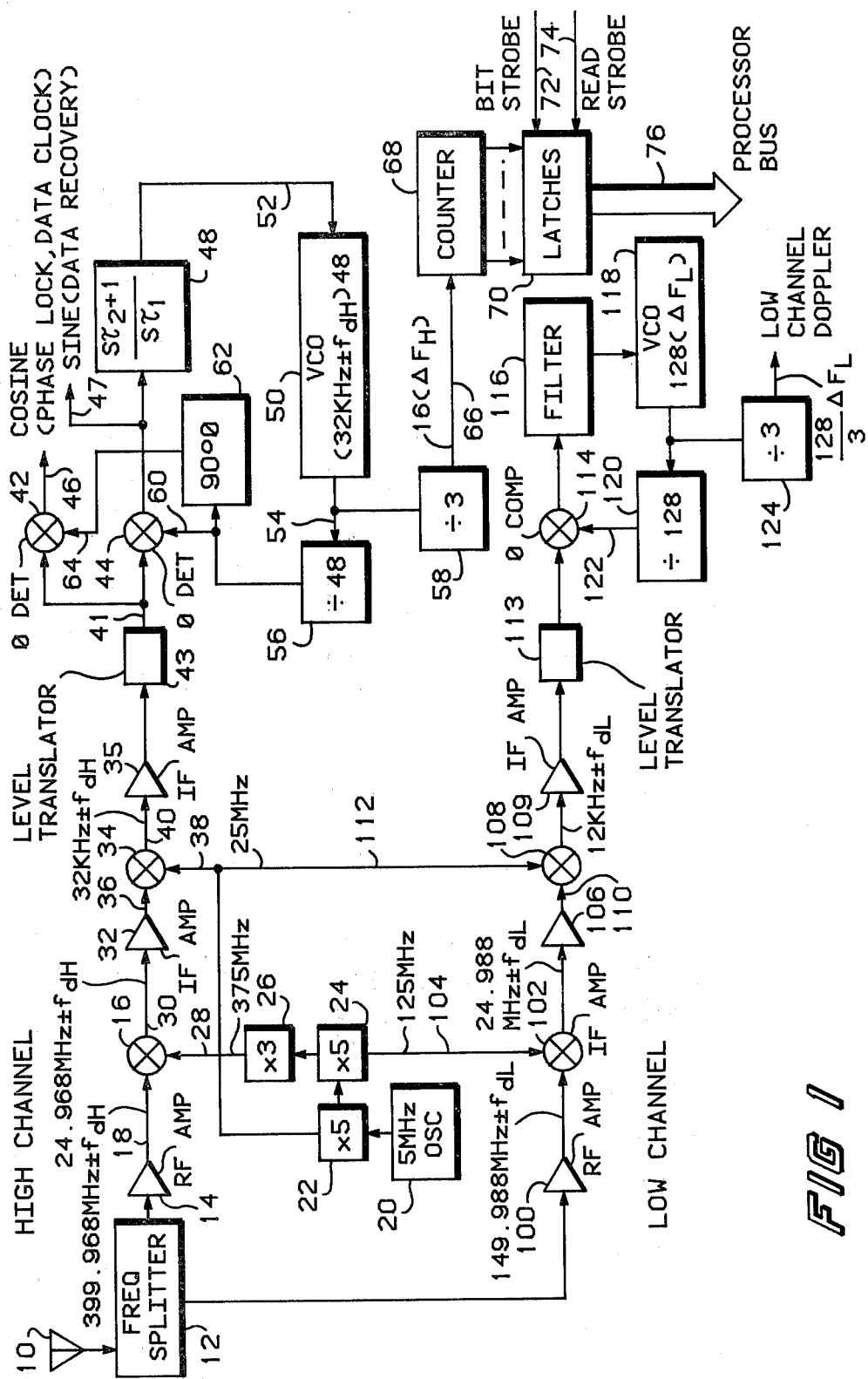

"Doppler", as used in the description of the embodiment set forth herein, may mean a baseband frequency ± Doppler (or the difference between a receiver reference frequency and a received frequency), or just Doppler alone, $f_d$. The former meaning contains a bias frequency term.

FIG. 1 is a block diagram of a navigational receiver employing the instant invention. Of course, the invention may be utilized whenever a cycle count or frequency measurement is desired of variable frequency signal. Antenna 10 feeds frequency splitter 12. Frequency splitter 12 produces a high band channel signal and a low band channel signal. The high band channel is amplified in RF amplifier 14, the frequency output of RF amplifier 14 being 399.968 megahertz $\pm f_{dH}$ (Doppler). This signal is fed to mixer 16 at terminal 18. Five megahertz oscillator 20 feeds times-five multipliers 22 and 24 and times-five multipler 24 feeds times-three multiplier 26 to generate a 375 megahertz input to mixer 16 at terminal 28. The output of mixer 16 appears at terminal 30 as 24.968 megahertz $\pm f_{dH}$. This signal is fed to IF amplifier 32 and then applied to mixer 34 at input terminal 36. The output of times-five multiplier 22 if fed to input terminal 38 of mixer 34 and the output signal of mixer 34 is a 32 kilohertz $\pm f_{dH}$ signal ($\Delta F_H$) appearing on terminal 40 where $f_{dH}$ is Doppler. This signal is fed to an input of IF amplifier 35 whose output is fed to limiter 43. Limiter 43 is a limiter or level translator that converts the signal level out of the receiver to logic levels which are compatible with the circuits of the phase locked loop of the invention. The signal is fed through limiter 43 to phase detectors 42 and 44 on line 41. The output of phase detector 42 provides a cosine output of the phase modulated input at terminal 46. This output provides indication of phase lock and provides for recovery of the system data clock. The output of phase detector 44, the sine output, is applied to filter 48, an $(s\tau_2+1)/s\tau_1$ filter. Filter 48 may be a passive or active loop filter. The output of filter 48 is fed to VCO 50 at input terminal 52. VCO 50 is designed to be responsive to the input signal 52 in a linear fashion over the expected range of Doppler frequencies required by the system, in this case from about 1056 kilohertz to 2016 kilohertz. This is true because, in the preferred embodiment of the invention as shown in FIG. 1, VCO 50 is operated at 48 times the Doppler frequency, $\Delta F_H$. The output of VCO 50 is fed to frequency divider 56 which divides the signal by 48 and to frequency divider 58 which divides the frequency by 3. The output of frequency divider 56 is fed to input 60 of phase detector 44. This completes the sine loop. The output of frequency divider 56 is also fed through 90° phase shifter 62 to input 64 of phase comparator 42. This completes the cosine loop of the phase locked loop. Output 54 of VCO 50 is divided by frequency divider 58 so that the output at terminal 66 is sixteen times the Doppler frequency. This signal is fed to counter 68 which is designed so that it will not overflow more than once for each bit time in the system. The parallel output of counter 68 is fed to latches 70. Latches 70 are controlled by bit strobe signal applied to input 72 and read strobe signal applied to input 74. The output of latches 70 is available on processor bus 76 and is fed to a system processor which determines the Doppler frequency of each sample.

Frequency splitter 12 also feeds RF amplifier 100. The output of RF amplifier 100 in the preferred embodiment of the invention as shown in FIG. 1 is 149.988 megahertz $\pm f_{dL}$. This signal is fed to mixer 102 where it is mixed with a 125 megahertz signal derived from times-five multiplier 24, an input to mixer 102 on input terminal 104. The output of mixer 102 is 24.988 megahertz $\pm f_{dL}$. This signal is fed to IF amplifier 106 and then to mixer 108 on input terminal 110. Another input 112 to mixer 108 supplies a 25 megahertz local oscillator signal from times-five multiplier 22. The output of mixer 108 is a 12 kilohertz $\pm f_{dL}$ ($\Delta F_L$) signal. This signal is applied through IF amplifier 109 and level translator 113 to phase comparator 114 and then to filter 116 which controls VCO 118. VCO 118 is designed to operate at 128 times the Doppler frequency. The output of VCO 118 is fed through frequency divider 120 which divides the signal from VCO 118 by 128. This divided signal is then fed to phase detector 114 through terminal 122. This completes the phase locked loop of the low channel. The output of VCO 118 is also fed to divide-by-three circuit 124 and provides a low channel Doppler signal at 128/3 times the Doppler frequency. Each of the signals $\Delta F_H$ and $\Delta F_L$ contains a bias frequency term of $-80$ ppm. In the navigational system in which the circuit is used, this bias or offset frequency is used to prevent $\Delta F$ from being negative. The counter and latches (68 and 70) of the high frequency channel would be duplicated with suitable count range in the low frequency channel. They are omitted to improve clarity in the high frequency channel.

A detailed implementation of the high channel phase lock loop, counter and latches of FIG. 1 are shown in FIG. 2. A similar circuit might be utilized in the low frequency channel. Where like reference numerals are utilized in FIGS. 1 and 2, they are equivalent elements. The output signal from mixer 34 (see FIG. 1) on line 40 is fed to exclusive OR gate 43 through C1 and R1. The output of exclusive OR gate 43 is fed back to the same input through resistor R2. A second input of exclusive OR gate 43 is connected to a source of reference voltage $+V_{DD}$ and, thus wired, exclusive OR gate 43 serves as a level translator. The output of level translator 43 appears on line 41 and provides one input to cosine phase detector 42 and one input to sine phase detector 44. The output of cosine phase detector 42 appears on line 46 and may be used as a coherent amplitude detector to provide phase lock indication and data clock recovery. Sine phase detector 44 provides an output on line 47 which may be used for data recovery purposes. Resistor R3 feeds this signal to one input of an operational amplifier 48 which includes amplifier AR1, 10 microfarad feedback capacitor C2, resistors R4, R5, R6, R7, R8 and R9 and capacitor C3. Potentiometer R8 is connected to ground through R7 and is connected to $V_{DD}$ through R6. The wiper of potentiometer R8 is connected to the junction of C3 and R9 to provide a bias level for the positive input to operational amplifier AR1 since the other terminal of R9 is connected to the pin 3 input of AR1. The output of AR1 is connected to 2200 ohm resistor R10 and 10 microfarad capacitor C2; the other end of C2 is connected through resistor R5 to the negative polarity input of AR1. This provides a feedback path for AR1 and the values for the accompanying resistors and capacitors are selected to provide a low pass active filter. The output of AR1 passes through resistor R10 to the input of VCO 50 on line 52. Capacitor C4, a 180 pf capacitor and $C_X$ are connected in parallel across pins 3 and 4 of VCO 50 to provide nominal frequency control within the integrated circuit. $C_X$ is selected for proper frequency operation of oscillator 50 when the circuit is tested. The output of VCO 50 is fed on line 54 to the input of divide-by-twelve circuit U4. One output, $16(\Delta F_H)$, from divide-by-twelve circuit U4 appears at pin 9 on line 66. Another output, $8(F_H)$, from U4 appears on pin 8 line 67. A third output from U4 appears at the $Q_o$ output on pin 12 and is fed through inverter 55 to divide-by-four circuit U5 input at pin 15. Together, dividers 53 and 59 comprise divide-by-48, 57. Of course, divider 57 may be selected to provide any suitable dividing factor, N. A first output, $2(\Delta F_H)$, of U5 appears at pin 6 and is fed to pin 3 of the type D flip-flop phase shifter 62. Another output, $\Delta F_H$, from U5 divide-by-four 59 is fed from pin 11 to pin 6 of exclusive OR phase detector 44 and to pin 5, the D input of flip-flop phase shifter 62. The Q output on pin 1 of flip-flop 62 is fed to exclusive OR cosine phase detector 42 on line 64.

In operation, level translator or exclusive OR gate 43 serves to translate receiver output levels to those required by the phase comparators. The output of level translator 43 is fed to an input of cosine phase detector 42. The other input to phase detector 42 comes from 90° phase shifter flip-flop 62. The output of phase detector 42 provides phase lock indication and a signal suitable for data clock recovery after further processing. The output from level translator 43 also feeds one input of exclusive OR (sine phase detector) 44. The signal out of sine phase detector 44 is acted upon by active filter 48 to provide a DC signal on line 52 which is a DC signal proportional to the phase error between signals on lines 41 and 60. This signal is used to control the frequency of controlled oscillator 50 which may be a voltage controlled oscillator (VCO) and, because VCO 50 is followed by divide-by-forty-eight counter or divider 57, the frequency of VCO 50 is 48 times the Doppler frequency. This signal, $48(\Delta F_H)$ appears on line 54 at the input to divider 53. The Q2 output on pin 9 of divider 53 is the input frequency on line 54 divided by 3. This means that the signal on line 66 from divider 53 is a signal which is $16(\Delta F_H)$. A divide-by-six output from divider 53 appears on pin 8 ($Q_3$) and is $8(\Delta F_H)$. The $Q_o$ output of divider 53 on pin 12 is the input frequency divided by twelve which is $4(\Delta F_H)$. Inverter 55 is used merely to accommodate the polarity differences between divider 53 and divider 59. Circuit 59 is a divide-by-four circuit which produces Doppler frequency at its output on $Q_1$, pin 11, line 60. $Q_o$ output on pin 6 is at a frequency of $2(\Delta F_H)$ and this signal is used to feed phase shifter 62 at pin 3, the clock input. The Q output on pin 1 of phase shifter 62 is fed to the pin 13 input of cosine phase detector 42.

It can be seen, then, that the 16 ($\Delta F_H$) output on line 66 from divide-by-twelve divider 53 may be utilized in counter 68 (of FIG. 1) and the resolution obtainable from the count of this signal is sixteen times more precise than would be a count of the Doppler frequency itself. In this system, one Doppler count represents a three-quarter meter change in slant range, therefore by receiving or processing the Doppler at sixteen times the actual frequency, range resolution of 3/64 of a meter is obtainable in the embodiment shown.

Parts which were used to construct the circuit of FIG. 2 are listed below:

Exclusive OR gates 43, 42 and 44 are part number MC14070BAL.

Flip-flop 62 is part number MC14013BAL.

VCO 50 is part of part number MC4324L.

Divide-by-twelve divider 53 is part number SN54LS92J.

Divide-by-four divider 59 is part number MC14029BAL.

Operational amplifier AR-1 is part number CA3140.

All of the above parts with "MC" and "SN" prefixes may be obtained from Motorola Inc. Semiconductor Products Group. Phoenix, Ariz., and operational amplifier AR1, part number CA3140, may be procured from Radio Corporation of America, Solid State Division, Summerville, N.J.

It may be seen that by utilizing the system of the invention, as described above, multiples of the Doppler frequency may be utilized for counting purposes in order to increase the resolution of the system. Of course, it will be clear to one of ordinary skill in the art that muliplication factors other than those taught herein may be used and that various tap points from the dividers may be used for purposes peripheral to Doppler counting. The embodiment presented here is intended to be descriptive of a preferred embodiment and, while the invention has been particularly shown and described with reference to the preferred embodiment thereof, it will be understood by those skilled in the art that various other modifications and changes may be made to the present invention from the principles of the invention described above without departing from the spirit and scope thereof as encompassed in the accompanying claims. Therefore it is intended in the appended claims to cover all such equivalent variations as come within the scope of the invention as described.

What is claimed is:

1. An improvement in a system for measuring cycle counts of an unknown frequency varying signal, comprising a phase locked loop having a phase detector, the phase detector having at least an output terminal and two input terminals, and a controlled oscillator having at least an output signal terminal, the improvement comprising:
    an N factor divider circuit having an input terminal and an output terminal, said input terminal of said divider being connected to the output terminal of the controlled oscillator, said output terminal of said divider being connected to one of the two input terminals of the phase detector; and
    a counter having an input terminal and a plurality of output terminals, said input terminal of said counter being connected to the output terminal of the controlled oscillator, said plurality of output terminals being adapted for producing an output signal responsive to a multiple of the cycle count of the unknown varying frequency, said multiple being equal to N.

2. An improved system for measuring cycle counts of an unknown frequency signal within a predetermined time span, the system comprising in combination:
    a phase locked loop, said phase locked loop further comprising:
        a phase detector having a first and second input and an output, said unknown signal being fed to said first input of said phase detector;
        a loop filter having an input and an output, said output of said phase detector being connected to said input of said filter;
        a controlled oscillator having an input and an output, said output of said filter being connected to said input of said controlled oscillator; and
        an N factor divider circuit having an input and at least one output, said output of said controlled oscillator being connected to said input of said N factor divider circuit and to an N factor multiplied output terminal of said phase locked loop, said output of said N factor divider circuit being connected to said second input of said phase detector; and
    means for counting cycles of a signal on said frequency N factor multipled output terminal during said predetermined time span.

3. The system according to claim 2 wherein said phase locked loop further comprises:
    another phase detector having a first and a second input and an output; and
    a phase shifter having at least one input and an output, said output of said phase shifter being connected to said second input of said another phase detector, said unknown signal being fed to said first input of said another phase detector, said at least one input of said phase shifter being connected to said at least one output of said N factor divider circuit; and
    means for indicating phase lock, said indicating means being connected and responsive to said output of said second phase detector.

4. The system according to claim 2 or 3 wherein said improved system further comprises: means for determining a frequency of the unknown signal by means of said counted cycles, the predetermined time and the factor N.

5. An improved method for measuring frequency of an unknown frequency varying signal utilizing a phase locked loop comprising the steps of:
    dividing an output of a controlled oscillator of the phase locked loop by a predetermined integral number N in a frequency divider circuit;
    comparing phases of an output signal of said frequency divider circuit and the unknown signal in a phase detector of the phase locked loop;
    filtering high frequency components from an output signal of said phase detector;
    controlling in frequency said output of said controlled oscillator with said filtered output signal of said phase detector so that said controlled oscillator output signal frequency is an N multiple of said unknown signal, said N multiple being said predetermined integral number N; and
    counting said controlled oscillator output over a predetermined period of time to determine a number of cycles of said controlled oscillator output occurring in said predetermined period of time.

6. The method according to claim 5 further comprising the step of:
    calculating an integral and fractional frequency of the unknown signal using said counted number of cycles, said predetermined integral number N and said predetermined time interval.

* * * * *